(12) United States Patent
Yonekawa et al.

(10) Patent No.: US 9,935,270 B2
(45) Date of Patent: Apr. 3, 2018

(54) ELECTROCHEMICAL LIGHT EMITTING CELL, COMPOSITION FOR FORMING LIGHT EMITTING LAYER OF ELECTROCHEMICAL LIGHT EMITTING CELL, AND IONIC COMPOUND FOR LIGHT EMITTING LAYER OF ELECTROCHEMICAL LIGHT EMITTING CELL

(71) Applicants: NIPPON CHEMICAL INDUSTRIAL CO., LTD., Tokyo (JP); WASEDA UNIVERSITY, Tokyo (JP)

(72) Inventors: Fumihiro Yonekawa, Tokyo (JP); Tomo Sakanoue, Tokyo (JP); Taishi Takenobu, Tokyo (JP)

(73) Assignees: NIPPON CHEMICAL INDUSTRIAL CO., LTD., Tokyo (JP); WASEDA UNIVERSITY, Tokyo (JP)

( * ) Notice: Subject to any disclaimer, the term of this patent is extended or adjusted under 35 U.S.C. 154(b) by 0 days.

(21) Appl. No.: 15/515,296

(22) PCT Filed: Dec. 3, 2015

(86) PCT No.: PCT/JP2015/083956
§ 371 (c)(1),
(2) Date: Mar. 29, 2017

(87) PCT Pub. No.: WO2016/093135
PCT Pub. Date: Jun. 16, 2016

(65) Prior Publication Data
US 2017/0244038 A1     Aug. 24, 2017

(30) Foreign Application Priority Data
Dec. 12, 2014   (JP) .................................. 2014-252416

(51) Int. Cl.
*H01L 51/00*    (2006.01)
*H01L 51/50*    (2006.01)

(52) U.S. Cl.
CPC ........ *H01L 51/0039* (2013.01); *H01L 51/004* (2013.01); *H01L 51/005* (2013.01);
(Continued)

(58) Field of Classification Search
CPC .............................. H01L 27/15; H01L 27/32
See application file for complete search history.

(56) References Cited

U.S. PATENT DOCUMENTS 5,682,043 A     10/1997  Pei et al.
2009/0243502 A1  10/2009 Kizaki et al.
(Continued)

FOREIGN PATENT DOCUMENTS

JP      2000-67601 A    3/2000
JP     2011-103234 A    5/2011
(Continued)

OTHER PUBLICATIONS

J. Shin and L. Edman; "Light-Emitting Electrochemical Cells with Millimeter-Sized Interelectrode Gap: Low-Voltage Operation at Room Temperature"; 2006; J. Am. Chem. Soc.; 128; p. 15568-15569.*

(Continued)

*Primary Examiner* — Su C Kim
*Assistant Examiner* — David S Wilbert
(74) *Attorney, Agent, or Firm* — Westerman, Hattori, Daniels & Adrian, LLP

(57) ABSTRACT

A light-emitting electrochemical cell 10 includes an emitting layer 12 and electrodes 13 and 14, one on each side of the emitting layer 12. The emitting layer 12 contains a light-emitting material and an ionic compound. The ionic com- (Continued)

pound has general formula (1), wherein M is N or P; $R_1$, $R_2$, $R_3$, and $R_4$ each independently represent a C1-C20 saturated aliphatic group; and X is preferably an anion having a phosphoric ester bond or a sulfuric ester bond. The light-emitting material is preferably an organic light-emitting polymer, a metal complex, an organic low molecular compound, or a quantum dot.

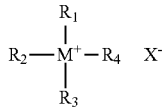

(1)

15 Claims, 1 Drawing Sheet

(52) U.S. Cl.
CPC ...... *H01L 51/0065* (2013.01); *H01L 51/0087* (2013.01); *H01L 51/502* (2013.01); *H01L 51/5032* (2013.01)

(56) References Cited

U.S. PATENT DOCUMENTS

| | | |
|---|---|---|
| 2011/0057151 A1 | 3/2011 | Chen et al. |
| 2012/0019161 A1* | 1/2012 | Edman ............ H01L 51/5032 315/291 |
| 2012/0091446 A1* | 4/2012 | Jung .................. C09K 11/06 257/40 |
| 2014/0014885 A1* | 1/2014 | Pan ................. A61N 5/0616 252/519.21 |

FOREIGN PATENT DOCUMENTS

| | | |
|---|---|---|
| JP | 2013-18689 A | 1/2013 |
| JP | 2013-171968 A | 9/2013 |

OTHER PUBLICATIONS

International Search Report dated Jan. 19, 2016, issued in counterpart International Application No. PCT/JP2015/083956 (1 page).
Decision to Grant a Patent dated Aug. 9, 2016, issued in counterpart Japanese Patent Application No. 2016-512134, w/English translation (6 pages).
Shin et al., "Light-Emitting Electrochemical Cells with Millimeter-Sized Interelectrode Gap: Low-Voltage Operation at Room Temperature", J. Am. Chem. Soc., 2006, vol. 128, pp. 15568-15569, cited in Specification (2 pages).
Extended European Search Report dated Dec. 14, 2017, issued in Application No. 15866496.1 (PCT/JP2015083956).

* cited by examiner

ELECTROCHEMICAL LIGHT EMITTING CELL, COMPOSITION FOR FORMING LIGHT EMITTING LAYER OF ELECTROCHEMICAL LIGHT EMITTING CELL, AND IONIC COMPOUND FOR LIGHT EMITTING LAYER OF ELECTROCHEMICAL LIGHT EMITTING CELL

TECHNICAL FIELD

The invention relates to a light-emitting electrochemical cell having an emitting layer containing a light-emitting material and an ionic compound. The invention also relates to a composition for forming an emitting layer of a light-emitting electrochemical cell.

BACKGROUND ART

In recent years, development of organic electro luminescent (organic EL) devices, which emit light by themselves using electrons and positive holes as carriers, has been progressing rapidly. Organic EL devices are characteristically superior to liquid crystal devices, which do not emit light by themselves and therefore need a backlight, in terms of possibility of thickness and weight reduction, visibility, and the like.

An organic EL device generally includes a pair of facing substrates having an electrode on their facing sides and an emitting layer interposed between the substrates. The emitting layer is formed of an organic thin film containing a light-emitting substance that emits light upon voltage application. The light emission mechanism of the organic. EL device is as follows; a voltage is applied to the organic thin film between the positive and the negative electrode to inject holes and electrons; the holes and electrons are recombined in the organic thin film; and the excitons generated by the recombination return to the ground state thereupon to emit light.

An organic EL device should have, in addition to the emitting layer, a hole or an electron injection layer for increasing the efficiency of hole or electron injection and a hole or an electron transport layer for increasing the hole/electron recombination efficiency, hens the emitting layer and each electrode. Consequently, an organic EL device has a complicate multi-layer structure and involves many manufacturing steps. Moreover, there are many restrictions in selecting the electrode materials forming positive and negative electrodes because the work function should be taken into consideration.

Light-emitting electrochemical cells (LECs) are recently attracting attention as a self-light-emitting device that can cope with the above described problems. An LEC generally has an emitting layer containing a salt and an organic light-emitting substance. With a voltage applied, the cations and anions of the salt move in the emitting layer toward the negative and the positive electrode, respectively, to provide a large electric field gradient (electric double layer) on the electrode interface. Because the thus formed electric double layer facilitates electron and hole injection by the respective electrodes, an LEC does not need to have such a multi-layer structure as needed by organic EL devices. Furthermore, in the manufacture of LECs, because consideration of the work function is not required in selecting the electrode materials, limitation to the electrode materials is not so great. For these reasons, LECs are promising self-emitting devices with expectation of great cost reduction compared with organic EL devices.

The salt used in the LECs is often an ionic compound, including inorganic ones, such as lithium salts and potassium salts, and organic ones, such as an ionic liquid (see, e.g., Patent Literatures 1 to 4 listed below). One of the merits of using an ionic compound consists in that cations and anions are easily re-arranged on the electrode interfaces to easily form an electric double layer, thereby facilitating injection of holes and electrons.

In particular, an emitting layer containing an organic ionic compound, such as an ionic liquid, has been under study as in Patent Literatures 1 and 2 because the use of the organic ionic compound increases the rate of re-arrangement of ions on the electrode interfaces. Patent Literature 5 below teaches increasing the life and efficiency of organic light-emitting electrochemical devices, including LECs, by the use of a non-polymeric organic ionic compound containing one ion having a functional organic group and another ion that is so small as to act as a mobile ion in films containing the organic ionic compound. The non-polymeric organic ionic compound is described as being composed of a mono-charged organic cationic compound and a mono-charged anionic compound. Non-Patent Literature 1 proposes a compound composed of an imidazolium cation and a sulfuric ester anion for use as an ionic compound in LECs.

CITATION LIST

Patent Literature

Patent Literature 1: JP 2011-103234A
Patent Literature 2: US 2012/019161A1
Patent Literature 3: JP 2013-171968A
Patent Literature 4: US 2012/091446A1
Patent Literature 5: US 2014/014885A1

Non-Patent Literature

Non-Patent Literature 1: J. Chem. Soc., vol. 128, pp. 15568-5569 (2006)

SUMMARY OF INVENTION

The aims of studying an organic ionic compound as one of emitting layer materials may include, in addition to increasing the rate of re-arrangement of ions, increasing the compatibility between the organic ionic compound and a light-emitting substance thereby to improve the properties of the organic thin film forming the emitting layer so that the efficiency of duping the light-emitting substance with holes or electrons may be increased and that movement of holes and electrons may be facilitated. It is considered that the compatibility between the organic ionic compound and a light-emitting substance is enhanced by the attractive interaction exerted between molecules. To achieve this, it is necessary to select the cation and anion species composing the ionic compound appropriately. Considering that there are many kinds of light-emitting substances available, development of an ionic compound excellent in compatibility with any kind of light-emitting substances has been awaited.

The inventors have conducted extensive investigation with the aim of solving the above problem and found as a result that an ionic compound composed of a phosphonium cation or an ammonium cation and an anion having an ester bond exhibits excellent compatibility with many light-emitting substances and is therefore capable of improving film properties of an organic thin film forming an emitting layer. The invention has been reached on the basis of this finding.

The invention provides a light-emitting electrochemical cell comprising an emitting layer and an electrode on each side of the emission layer, the emitting layer containing a light-emitting material and an ionic compound, and the ionic compound being represented by general formula (1).

[Chem. 1]

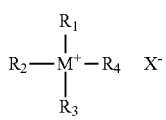

(1)

wherein M represents N or P; $R_1$, $R_2$, $R_3$, and $R_4$ each independently represent a saturated aliphatic group having 1 to 20 carbon atoms; and X represents an anion having an ester bond.

The invention also provides a composition for forming an emitting layer of a light-emitting electrochemical cell, comprising an ionic compound represented by general formula (1), a Light-emitting material, and an organic solvent.

The invention also provides an ionic compound for use in an emission layer of a light-emitting electrochemical cell being represented by general formula (1).

BRIEF DESCRIPTION OF DRAWINGS

FIG. 2(a) shows the state before voltage application, and FIG. 2(b) represents the state after voltage application.

DESCRIPTION OF EMBODIMENTS

The LEC of the invention will be described on the basis of its preferred embodiments with reference to the accompanying drawings. As will be described, an LEC 10 of the present embodiment is characterized by using an ionic compound having a specific anion species.

Figure 1:
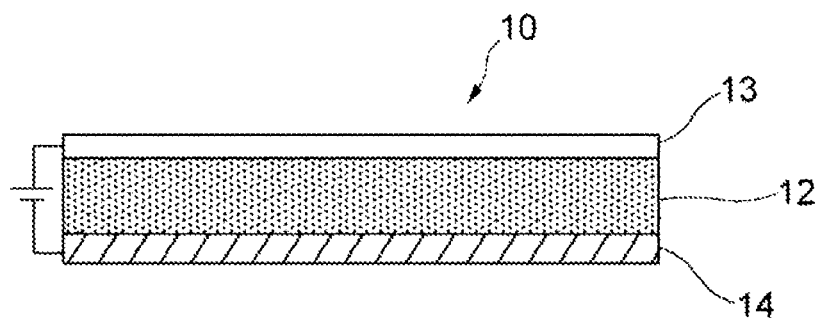
FIG. 1 is a schematic cross-sectional view of an embodiment of the LEC of the invention.

As illustrated in FIG. 1, the LEC 10 of the embodiment includes an emitting layer 12 and electrodes 13 and 14, one on each side of the emitting layer 12. Specifically, the LEC 10 has a pair of electrodes (designated a first electrode 13 and a second electrode 14) that face to each other and the emitting layer 12 sandwiched in between the two electrodes 13 and 14. The LEC 10 is configured to cause the emitting layer to emit light on voltage application. The LEC 10 is designed for use as various displays and the like. In FIG. 1, a direct-current power source is used as a power source, and the first electrode 13 and the second electrode 14 are connected to the positive and negative terminal of the power source, respectively. In an opposite manner, the first electrode 13 and the second electrode 14 may be connected to the negative and positive terminal, respectively. An alternate-current power source may be used in place of the DC power source.

The first electrode 13 and the second electrode 14 may be transparent (light-transmissive), semi-transparent, or opaque. Transparent electrodes may be of a metal oxide, such as indium-doped tin oxide or fluorine-doped tin oxide, or a transparent polymer, such as impurity-doped poly(3,4-ethylenedioxythiophene) (PEDOT). Semi-transparent or opaque electrodes may be of metals, such as aluminum (Al), silver (Ag), gold (Au), platinum (Pt), tin (Sn), bismuth (Bi), copper (Cu), chromium (Cr), zinc (Zn), and magnesium (Mg).

It is preferred that at least one of the first electrode 13 and the second electrode 14 be transparent so that the light emitted from the emitting layer 12 may easily be taken out of the cell. It is preferred that one of the electrodes be transparent with the other being an opaque metal electrode so that the light emitted from the emitting layer 12 may be taken out of the cell while being reflected on the metal electrode. Both the first electrode 13 and the second electrode 14 may be transparent to provide a transparent LEC. The LEC 10 may be designed to serve as a laser oscillation device by making both the first electrode 13 and the second electrode 14 of a metal having high reflectivity, such as Ag, and adjusting the thickness of the emitting layer 12.

When the first electrode 13 and the second electrode 14 are a transparent electrode and an opaque or semi-transparent metal electrode, respectively, it is preferred for the first electrode 13 to have a thickness of, for example, 10 to 500 nm in order to have appropriate resistivity and light transmission properties. Similarly, it is preferred for the second electrode 14 to have a thickness of, for example, 10 to 500 nm in order to have appropriate resistivity and light transmission properties.

The emitting layer 12 is formed of a mixture of a light-emitting material and an ionic compound. The emitting layer 12 may be either solid or liquid. The emitting layer 12 winch is solid is capable of retaining a given shape and resisting the force applied from the outside.

The term "light-emitting material" as used herein means a substance that functions as electron and hole carrier when doped with anions and cations (i.e., has a hole- and electron-transporting function) and emits light on combination of electrons and holes (i.e., has a light-emitting function). Therefore, the term "light-emitting material" as simply referred to herein denotes a conductive light-emitting material. The light-emitting material for use in the invention may be a material capable of performing both the hole- and electron-transporting function and the light-emitting function or a combination of a first material having a hole- and/or electron-transporting function and a second material that receives holes and electrons from the first material to emit light.

In the former case, the material capable of performing both the hole- and electron-transporting function and the light-emitting function is exemplified by an organic light-emitting polymer that will be described later in detail. In the latter case, the first material having a hole- and/or electron-transporting function is exemplified by an organic conductive polymer. As will be described later, examples of the organic conductive polymer include not only the organic light-emitting polymer but organic polymers having conductivity but no or low light-emitting function, such as polyvinylcarbazole. The second material that receives holes and electrons from the first material to emit light is usually a material other than organic polymers, being exemplified by metal complexes, organic low molecular compounds, and quantum dots as will be described infra. Hence, the term "light-emitting material" as used herein is intended to include an organic conductive polymer having no or low light-emitting function as long as it is used in combination with a light-emitting material other than the organic polymers, such as metal complexes, organic low molecular compounds, and quantum dots. Accordingly, when a combination of the organic conductive polymer and a metal complex, an organic low molecular compound, or a quantum dot is used as a light-emitting material, the term "compatibility with a light-emitting material" as will be used hereunder is intended to include the compatibility with the conductive polymer.

The ionic compound contained in the emitting layer is a substance assuring ion movement to easily form electric double layers thereby to facilitate hole and electron injection. In the embodiment, the compound represented by general formula (1) (hereinafter also referred to as the ionic compound (1)) is used as the ionic compound. The ionic compound (1) is a phosphonium or ammonium salt. As stated earlier, the ionic compound (1) is characterized by having a specific anion species, specifically an anion having an ester bond. The phrase "an anion having an ester bond" refers to an anion having an ester bond site in its structure. As a result of the inventors' researches, the LEC of the embodiment which contains the ionic compound (1) having an anion having an ester bond unexpectedly proved excellent in compatibility with many light-emitting substances. Consequently, the surface emission of an LEC can be achieved uniformly. Furthermore, increased brightness of emitted light is obtained with a low applied voltage so that a high luminance is produced while holding down the power consumption.

The ionic compound (1) may be either solid or liquid at ambient temperature (25° C.). Whether the ionic compound (1) assumes a solid or liquid state depends on the selected combination of a cation and an anion and the structure of the side chains $R_1$, $R_2$, $R_3$, and $R_4$ of the cation. The ionic compounds (1) may be used either individually or in combination of two or more thereof in the invention. When two or more ionic compounds (1) are used in combination, all of them may be solid at ambient temperature, or all of them may be liquid at ambient temperature. Alternatively, at least one of them may be liquid at ambient temperature with at least another one of them being solid at ambient temperature.

In formula (1). $R_1$, $R_2$, $R_3$, and $R_4$, which may be the same or different, each represents a saturated aliphatic group. The saturated aliphatic group is preferably selected from straight or branched alkyl groups having 1 to 20 carbon atoms, such as methyl, ethyl, propyl, isopropyl, n-butyl, s-butyl t-butyl, isobutyl, amyl, isoamyl, t-amyl, hexyl, heptyl, isoheptyl, t-heptyl, n-octyl, isooctyl, 2-ethylhexyl, t-octyl, nonyl, isononyl, decyl, isodecyl, undecyl, dodecyl, tridecyl, isotridecyl, tetradecyl, hexadecyl, octadecyl, and eicosyl. The number of the carbon atoms of the saturated aliphatic group is, preferably 1 to 12, more preferably 2 to 8. The ionic compound (1) in which the saturated aliphatic groups are selected from these preferred groups provides an emitting layer having high dielectric strength.

It is preferred that all of $R_1$, $R_2$, $R_3$, and $R_4$ be the same or three of them be the same, being represented by $R_A$, with the rest being different from $R_A$, being represented by $R_B$, $R_A$ having more carbon atoms than $R_B$. The difference between $R_A$ and $R_B$ in the number of carbon atoms is preferably 1 to 7, more preferably 2 to 4. By using a cation having such a structure, excellent light emission characteristics are exhibited while retaining good compatibility with the light-emitting material.

Examples of preferred cations having the above described saturated aliphatic groups include, as examples of phosphonium ions, tetraethylphosphonium, triethylmethylphosphonium, tetrapropylphosphonium, tripropylmethylphosphonium, tripmpylethylphosphonium, tetra(n-butyl)phosphonium, tri(n-butyl)methylphosphonium, tri(n-butyl)ethylphosphonium, tetra(n-hexyl)phosphonium, tri(n-hexyl)methylphosphonium, ethyltri(n-hexyl)phosphonium, butyltri(n-hexyl)phosphonium, tri(n-octyl)(n-butyl)phosphonium, tri(n-octyl)ethylphosphonium, and tri(n-octyl)methylphosphonium ions; and, as example of ammonium ions, tetraethylammonium, triethylmethylammonium, tetrapropylammonium, tripropylmethylammonium, tripropylethylammonium, tetra(n-butyl)ammonium, tri(n-butyl)methylammonium, tri(n-butyl)ethylammonium, tetra(n-hexyl)ammonium, tri(n-hexyl)methylammonium, ethyltri(n-hexyl)ammonium, butyltri(n-hexyl)ammonium, tri(n-octyl)(n-butyl)ammonium, tri(n-octyl)ethylammonium, and tri(n-octyl)methylammonium.

In general formula (1), part of the hydrogen atoms bonded to the carbon atom(s) making up the saturated aliphatic group may be replaced by a fluorine atom. Fluorine introduction brings about improvement on dielectric strength, leading, to the improvements on the stability and service life of the LEC.

As discussed previously, the anion of the ionic compound (1) has an ester bond. As used herein, the term "ester bond" denotes a bond formed by condensation reaction between an organic or inorganic oxo acid and a compound having a hydroxy group or a thiol group. Examples of the ester bond in the anion of the ionic compound (1) include a phosphoric ester bond formed by the reaction between phosphoric acid and an alcohol, a sulfuric ester bond formed by the reaction between sulfuric acid and an alcohol, a thioester bond formed by the reaction between a carboxylic acid and a thiol, a nitric ester bond formed by the reaction between nitric acid and an alcohol, and a carbonic ester bond formed by the reaction between carbonic acid and an alcohol.

An anion having a phosphoric ester bond or a sulfuric ester bond is particularly preferred; for an ionic compound (1) having such an anion exhibits particularly high compatibility with many light-emitting substances.

Especially preferred anions include a phosphoric ester anion of general formula (2) and a sulfuric ester bond of general formula (3):

$$PO_2(OR)_2 \qquad (2)$$

$$SO_3(OR) \qquad (3)$$

wherein R in each occurrence independently represents a saturated aliphatic group having 1 to 20 carbon atoms.

In general formulae (2) and (3), R is preferably a straight or branched alkyl group having 1 to 20 carbon atoms, such as methyl, ethyl, propyl, isopropyl, n-butyl, s-butyl, t-butyl, isobutyl, amyl, isoamyl, t-amyl, hexyl, heptyl, isoheptyl, t-heptyl, n-octyl, isooctyl, 2-ethylhexyl, t-octyl, nonyl, isononyl, decyl, isodecyl, undecyl, dodecyl, tridecyl, isotridecyl, tetradecyl, hexadecyl, octadecyl, and eicosyl. The saturated aliphatic group R preferably has 1 to 12 carbon atoms, more preferably 2 to 8 carbon atoms. With the anion having the above described saturated aliphatic group, a light-emitting layer with excellent dielectric strength is obtained.

It is preferred for the anion of the ionic compound (1) to have a group that is the same as at least one of $R_1$, $R_2$, $R_3$, and $R_4$ of the cation. Specifically, R of the anion represented by formula (2) or (3) is preferably the same as at least one of $R_1$, $R_2$, $R_3$, and $R_4$. It is particularly preferred that the ionic compound (1) be represented by $P(R_X)_3R_Y \cdot PO_2(OR_Y)_2$ or $P(R_X)_4 \cdot PO_2(OR_X)_2$ in view of higher compatibility with many light-emitting substances and ease of preparation of the ionic compound (1).

The ionic compound (1) can be prepared, for example, as follows. In the case of the ionic compound (1) composed of a phosphonium cation and an anion having a phosphoric ester bond, a tertiary phosphine compound $P(R_X)_3$ corresponding to the intended phosphonium cation and a compound of formula $PO(OR_Y)_3$ are allowed to react with each other to give the ionic compound (1) represented by formula $P(R_X)_3 R_Y \cdot PO_2(OR_Y)_2$. A tertiary phosphine compound $P(R_X)_3$ and a compound of formula $PO(OR_X)_3$ are allowed to react with each other to give the ionic compound (1) represented by formula $P(R_X)_4 \cdot PO_2(OR_X)_2$.

In the case of the ionic compound (1) composed of a phosphonium cation and an anion having a sulfuric ester bond, a tertiary phosphine compound $P(R_X)_3$ corresponding, to the intended phosphonium cation and a compound of formula $SO_2(OR_Y)_2$ are allowed to react with each other to give the ionic compound (1) represented by formula $P(R_X)_3 R_Y \cdot SO_3(OR_Y)$. A tertiary phosphine compound $P(R_X)_3$ and a compound of formula $SO_2(OR_X)_2$ are allowed to react with each other to give the ionic compound (1) represented by formula $P(R_X)_4 \cdot SO_3(OR_X)$.

In the case of the ionic compound (1) composed of an ammonium cation and an anion having a phosphoric ester bond, a tertiary amine compound $N(R_X)_3$ corresponding to the intended ammonium cation and a compound of formula $PO(OR_Y)_3$ are allowed to react with each other to give the ionic compound (1) represented by formula $N(R_X)_3 R_Y \cdot PO_2(OR_Y)_2$. A tertiary amine compound $N(R_X)_3$ and a compound of formula $PO(OR_X)_3$ are allowed to react with each other to give the ionic compound (1) represented by formula $N(R_X)_4 \cdot PO_2(OR_X)_2$.

In the case of the ionic compound (1) composed of an ammonium cation and an anion having a sulfuric ester bond, a tertiary amine compound $N(R_X)_3$ corresponding to the intended ammonium cation and a compound of formula $SO_2(OR_Y)_2$ are allowed to react with each other to give the ionic compound (1) represented by formula $N(R_X)_3 R_Y \cdot SO_3(OR_Y)$. A tertiary amine compound $N(R_X)_3$ and a compound of formula $SO_2(OR_X)_2$ are allowed to react with each other to give the ionic compound (1) represented by formula $N(R_X)_4 \cdot SO_3(OR_X)$.

The ionic compounds (1) obtained by the above described methods are in principle halogen-free. It is important in view of enhancing the reliability of the LEC that the ionic compound (1) be halogen-free. Nevertheless, partial introduction of fluorine to the ionic compound (1) is acceptable as previously discussed in view of increasing the dielectric strength of the LEC.

As described earlier, the light-emitting material to be used in the emitting layer 12 may be an organic light-emitting polymer or a combination of at least one light-emitting substance selected from metal complexes, organic low molecular compounds, and quantum dots and an organic conductive polymer (inclusive of a light-emitting conductive material and a non-light-emitting conductive material).

The ionic compound (1) is also useful as an ionic compound for emitting layer of an LEC. The ionic compound for emitting layer according to the invention, which is of the LEC containing the ionic compound (1), may contain only the ionic compound (1) or may further contain a component other than the ionic compound (1), such as a solvent and a surfactant other than the ionic compound (1). Examples of useful solvents will be given later. The surfactant that can be used may be chosen from known surfactants conventionally used in LECs and organic EL devices. The ionic compound for emitting layer according to the invention preferably comprises 90 mass % or more, more preferably 95 mass % or more, and up to 100 mass %, of the ionic compound (1), taking into consideration convenience of use in blending with the light-emitting material.

The content of the ionic compound (1) in the emitting layer 12 is preferably 1 to 30 mass %, more preferably 5 to 20 mass %, in terms of securing ion mobility and improving properties of forming film (emitting layer 12). The content of the ionic compound (1) in the emitting layer 12 is preferably 10 to 25 parts by mass per 100 parts by mass of the light-emitting material. The amount of the light-emitting material as referred to here is the amount of an organic light-emitting polymer used as a sole light-emitting material or the total amount of an organic conductive polymer and a light-emitting substance, such as a metal complex, an organic low molecular compound, or a quantum dot, used in combination as a light-emitting material. The LEC of the invention may use an ionic compound other than the ionic compound (1), such as an ionic liquid, in addition to the ionic compound (1). In such a case, the content of the ionic compound other than the ionic compound (1) is preferably 100 parts by mass or less, more preferably 50 parts by mass or less, per 100 parts by mass of the ionic compound (1).

In the cases where the light-emitting material in the emitting layer 12 is an organic light-emitting polymer, the organic light-emitting polymer serves as an electron carrier and a hole carrier on being doped with an anion and a cation and is excited by electron/hole combination to emit light. Such an organic light-emitting polymer is exemplified by various π-conjugated polymers. Examples of useful π-conjugated polymers include homopolymers of p-phenylenevinylene, fluorene, 1,4-phenylene, thiophene pyrrole, p-phenylene sulfide, benzothiadiazole, biothiophene, or a substituted derivative thereof and copolymers comprising the same. Examples of the substituent of the substituted derivatives include C1-C20 alkyl groups, C1-C20 alkoxy groups, C6-C18 aryl groups, and $(-CH_2CH_2O-)_n CH_3$ (wherein n is an integer of 1 to 10). The copolymers include those composed of two or more repeating units of the π-conjugated homopolymers enumerated above. The copolymers may be random, alternate, block, or a combination thereof. Homo- or copolymers of fluorene, p-phenylenevinylene, or a substituted derivative thereof are particularly preferred. Commercially available organic light-emitting polymers are also useful. Examples of such commercial products include poly[(9,9-dioctylfluorenyl-2,7-diyl)-alt-co-(9,9'-spirobifluorene-2,7-diyl)] available from Solaris Chem under the trade name "SOL2412", phenylene substituted poly(p-phenylenevinylene) available from Merck under the trade name "PDY-132", and poly[(9,9-di-n-octylfluorenyl-2,7-diyl)-alt-(benzo[2,1,3]thiadiazol-4,8-diyl)] available from Aldrich. These polymers may be used either individually or in combination of two or more thereof.

When in using a metal complex as a light-emitting material in the emitting layer 12, metal complexes known for use as a light-emitting material for organic EL devices may be used. Illustrative of useful metal complexes are tris(8-quinolinolato)aluminum, tris(4-methyl-8-quinolinolato)aluminum, bis(8-quinolinolato)zinc, tris(4-methyl-5-trifluoromethyl-8-quinolinolato)aluminum, tris(4-methyl-5-cyano-8-quinolinolato)aluminum, bis(2-methyl-5-trifluoromethyl-8-quinolinolato)[4-(4-cyanophenyl) phenolato]aluminum, bis(2-methyl-5-cyano-8-quinolinolato)[4-(4-cyanophenyl)phenolato]aluminum, tris(8-quinolinolato)scandium, bis[8-(p-tosyl)aminoquinoline]

zinc; cadmium complexes; phosphorescent light-emitting materials, such as iridium complexes; ruthenium complexes having bipyridyl (bpy) or a derivative thereof or phenanthroline or a derivative thereof as a ligand; and octaethyl (porphyrin)platinum. These metal complexes may be used either individually or in combination of two or more thereof.

When in using an organic low molecular compound as a light-emitting material in the emitting layer 12, organic low molecular compounds known for use in organic EL devices may be used. Examples of useful organic low molecular compounds include fluorescent substances, such as 9,10-diarylanthracene derivatives, pyrene, coronene, perylene, rubrene, 1,1,4,4-tetraphenylbutadiene, 1,2,3,4-tetraphenylcyclopentadiene, pentaphenylcyclopentadiene, poly-2,5-diheptyloxy-p-phenylenevinylene, 4-(dicyanomethylene)-2-methyl-6-(4-dimethylaminostyryl)-4H-pyran, coumarin fluorescent materials, perylene fluorescent materials, pyrene fluorescent materials, anthrone fluorescent materials, porphyrin fluorescent materials, quinacridone fluorescent materials, N,N'-dialkyl-substituted quinacridone fluorescent materials, naphthalimide fluorescent materials, and N,N'-diaryl-substituted pyrrolopyrrole fluorescent materials. These compounds may be used either individually or in combination of two or more thereof. As used herein, the term "organic low molecular compounds" denotes organic compounds other than those obtained by polymerization reaction.

When in using a quantum dot as a light-emitting material in the emitting layer 12, illustrative examples of useful quantum dots include simple substances, such as C, Si, Ge, Sn, P, Se, and Te; combinations of Zn, Cd, Hg, Pb, or the like providing a divalent cation and O, S, Se, Te, or the like providing a divalent anion; combinations of Ga, In, or the like providing a trivalent cation and N, P, As, Sb, or the like providing a trivalent anion; and a multiple combination thereof. Specific examples of such combinations include GaN, GaP, CdS, CdSe, CdTe, InP, InN, ZnS, $In_2S_3$, ZnO, CdO, and composites or mixtures thereof. Chalcopyrite compounds are suitable multiple combinations, including $CuAlS_2$, $CuGaS_2$, $CuInS_2$, $CuAlSe_2$, $CuGaSe_2$, $AgAlS_2$, $AgGaS_2$, $AgInS_2$, $AgAlSe_2$, $AgGaSe_2$, $AgInSe_2$, $AgAlTe_2$, $AgGaTe_2$, $AgInTe_2$, $Cu(In,Al)Se_2$, $Cu(In,Ga)(S,Se)_2$, $Ag(In,Ga)Se_2$, and $Ag(In,Ga)(S,Se)_2$. These quantum dots may be used either individually or in combination of two or more thereof.

Examples of the organic conductive polymer for transporting electrons and/or holes include polyvinylcarbazole, polyphenylene, polyfluorene, polyaniline, polythiophene, polypyrrole, polyphenylenevinylene, polythienylenevinylene, polyquinoline, and polyquinoxaline. The aforementioned organic light-emitting polymers are also useful as an organic conductive polymer because of their electron and/or hole transporting function. These organic conductive polymers may be used either individually or in combination of two or more thereof.

There are preferred ranges of the content of the light-emitting material in the emitting layer 12 with a view to sufficiently bringing out its function. In the case of using the organic light-emitting polymer, the content is preferably 60 to 99 mass %, more preferably 70 to 98 mass %. In using a combination of a light-emitting substance, such as a metal complex, an organic low molecular compound, or quantum dots, and the organic conductive polymer, the total content of the combination in the emitting layer 12 is preferably 60 to 99 mass %, more preferably 70 to 98 mass %.

In using a combination of a light-emitting substance, such as a metal complex, an organic low molecular compound, or quantum dots, and the organic conductive polymer, the organic conductive polymer is preferably used in an amount of 5 to 25 parts by mass per 100 parts by mass of the light-emitting substance, such as a metal complex, an organic low molecular compound, or quantum dots.

The emitting layer 12 may contain a component other than the light-emitting material and the ionic compound. Illustrative of such a component are surfactants, polymeric components for improving conductivity (e.g., polyethylene oxide), polymeric components for improving film-forming properties (e.g., polystyrene and poly(methyl methacrylate) (PMMA)), and salts other than organic salts. When the organic light-emitting polymer is used as a light-emitting material, the organic conductive polymer, such as polyvinylcarbazole, is regarded as included in "other component". The total content of the other components (except a solvent) other than the light-emitting material and the ionic compound in the emitting layer 12 is preferably not more than 30 parts, more preferably not more than 20 parts, even more preferably not more than 10 parts, per 100 parts by mass of the emitting layer 12.

The emitting layer 12 having the above composition preferably has a thickness of 20 to 300 nm, more preferably 50 to 150 nm. With this thickness, light emission can be obtained from the emitting layer 12 sufficiently and efficiently, and occurrence of defects in the emitting region can be reduced to prevent short circuit between electrodes.

The LEC 10 of the embodiment can be produced by for example, the following method. A substrate having the first electrode 13 is provided. For example, an ITO electrode as the first electrode 13 may be formed by patternwise depositing ITO film on a substrate, such as a glass plate, by photolithography or a combination of photolithography and a lift-off process.

Next, the ionic compound (1) and a light-emitting material are dissolved in an organic solvent to prepare a composition for forming an emitting layer (hereinafter refereed to as "an emitting layer-forming composition") of an LEC. In order to efficiently mix the ionic compound (1) and the light-emitting material, it is preferred to use an organic solvent containing at least one selected from the group consisting of toluene, benzene, tetrahydrofuran, carbon disulfide, dimethyl chloride, chlorobenzene, and chloroform. In this preferred case, only one of the solvents listed above or only a combination of two or more of the solvents listed may be used as the organic solvent, or alternatively, the solvent(s) listed above may be used in combination with other organic solvents, such as methanol and ethanol, as long as the characteristics of the listed solvents, such as dissolving capability are not impaired. In other words, the organic solvent in which the ionic compound (1) and the light-emitting material are to be dissolved may contain at least one organic solvent selected from the group consisting of toluene, benzene, tetrahydrofuran, carbon disulfide, dimethyl chloride, chlorobenzene, and chloroform and another solvent or other solvents.

The mass ratio of the ionic compound (1) to the light-emitting material to be mixed together to prepare an emitting layer-forming composition is preferably 1:4 (the former:the latter) to 100. The amount of the solvent is preferably such that each of the concentration of the light-emitting material and that of the ionic compound in the solvent is 2 to 20 g/l. The term "amount of the light-emitting material" as referred to herein means the amount of the organic light-emitting polymer used alone as a light-emitting material or the total amount of the light-emitting substance, such as a metal complex, an organic low molecular compound, or a quantum dot, and the organic conductive polymer when they are used in combination as a light-emitting material. The emitting layer-forming composition is applied to the first electrode 13 formed on the substrate by, for example, spin coating, followed by drying to remove the organic solvent by evaporation, thereby to form an emitting layer 12. The preparation of the emitting layer-forming composition and the formation of the emitting layer 12 are preferably carried out in an inert gas atmosphere having a moisture content of 100 ppm or less. Illustrative of the inert gas are argon, nitrogen, and helium. Further, the preparation of the emitting layer-forming composition and the formation of the emitting layer 12 are preferably carried out in a clean room or a glove box because incorporation of foreign matter, such as airborne particles, into the emitting layer can cause formation of a non-emitting portion. The clean environment is preferably of class 10000 or cleaner, more preferably class 1000 or cleaner. The other details of the emitting layer-forming composition are the same as has been and will be described with respect to LECs.

A second electrode 14 is then formed on the emitting layer 12. For example, aluminum (Al) is filmwise deposited on the emitting layer 12 by vacuum evaporation through a mask to form an electrode pattern. The second electrode 14 is thus formed on the emitting layer 12 to provide an LEC 10 illustrated in FIG. 1.

Figure 2A:
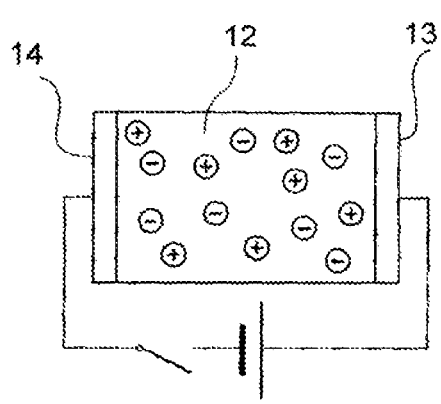
FIG. 2(a) and FIG. 2(b) are each a conceptual diagram representing the light emission mechanism of an LEC.
Figure 2B:
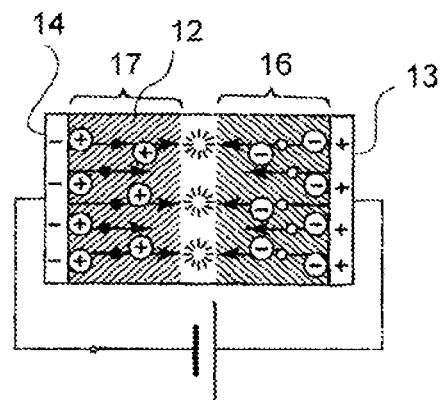

The LEC 10 of the embodiment emits light through the following emission mechanism. As illustrated in FIGS. 2(a) and 2(b), a voltage is applied to the emitting layer 12 with the first electrode 13 serving as a positive electrode and the second electrode 14 as a negative electrode, whereupon the ions in the emitting layer 12 move along the electric field. Anions gather in a layer near the interface with the first electrode 13, while cations gather in a layer near the interface with the second electrode 14, to form an electric double layer on the interface with each electrode. The first electrode 13 (positive electrode) dopes the emitting layer 12 with holes to spontaneously form a p-doped region 16 near the first electrode 13, while the second electrode 14 (negative electrode) dopes the emitting layer 12 with electrons to spontaneously form an n-doped region 17 near the second electrode 14. These doped regions provide a p-i-n junction with a high carrier density. Then, holes and electrons are injected from the p-doped region 16 and the n-doped region 17, respectively, to form excitons in the i-layer. The exciton energy excites the emitting layer 12. The excited emitting layer 12 returns to the ground state to emit light. Light emission is thus obtained from the emitting layer 12. To obtain light of desired wavelengths, the light-emitting material should be selected such that the band gap, which refers to the energy difference between the highest occupied molecular orbital and the lowest unoccupied molecular orbital, may correspond to the desired wavelength.

EXAMPLES

The invention will now be illustrated in greater detail with reference to Examples, but it should be understood that the invention is not deemed to be limited thereto. The characteristics were determined in Examples and Comparative Examples by the following methods.
Determination of Luminance:

(1) In Examples 1 to 20 and Comparative Examples 1 to 10

The first electrode of the LEC obtained was connected to the positive terminal of a direct current, and the second electrode to the negative terminal. A voltage was applied at a sweep rate of 1 V/sec up to 15 V. The maximum luminance reached during the voltage application was taken as the luminance of the LEC. Measurements were made using a luminance meter CS-2000 from Konica Minolta.

(2) In Examples 21 to 24

The tint electrode of the LEC obtained was connected to the positive terminal of a direct current, and the second electrode to the negative terminal. A voltage was applied at a sweep rate of 1 V/sec up to 6 V. The luminance measured at 6 V was taken as the luminance of the LEC. Measurements were made using a luminance meter CS-2000 from Konica Minolta.

Examples 1 to 15

Examples in which a phosphonium cation was used as a cations of the ionic compound are presented.

A commercially available glass substrate coated with an ITO film (ITO film thickness: 200 nm; available from Geomatec) was used as a first electrode 13.

A mixed solution was prepared using the organic light emitting polymer shown in Table 1 as a light emitting material and the compound shown in Table 1 as an ionic compound. Specifically, an organic light-emitting polymer solution in toluene (conc.: 9 g/l) and an ionic compound solution in toluene (conc.: 9 g/l) were mixed at a volume ratio of 4:1 (the former:the latter) in a glove box filled with argon at mom temperature to prepare an emitting layer-forming composition.

The emitting layer-forming composition prepared above was applied to the first electrode 13 of the glass substrate by spin coating at room temperature in the glove box filled with argon and dried on a hot plate at 50° C. for 30 minutes to remove the organic solvent by evaporation thereby to form a solid emitting layer 12 having a thickness of 100 nm. A second electrode 14 of aluminum (Al) was then deposited on the emitting layer 12 to a thickness of 50 nm by the above described method. There was thus obtained an LEC 10 having a 2 mm-side square emitting area. The results of the determination of emission characteristics of the resulting LEC are shown in Table 1.

Examples 16 to 20

Examples in which an ammonium cation was used as a cation of the ionic compound are presented.

A mixed solution was prepared using the organic light-emitting polymer shown in Table 1 as a light-emitting material and the compound shown in Table 1 as an ionic compound. Specifically, an organic light-emitting polymer solution in toluene (conc.: 9 g/l) and an ionic compound solution in toluene (conc.: 9 g/l) were mixed at a volume ratio of 4:1 (the former:the latter) in a glove box tilled with argon at room temperature to prepare an emitting layer-forming composition. An LEC 10 was made in otherwise the same manner as in Example 1. The results of the determination of the emission characteristics of the resulting LEC 10 are shown in Table 1.

Comparative Examples 1 to 4

Comparative Examples in which the ionic compound has an anion other than the anion having an ester bond are presented.

A commercially available glass substrate coated with an ITO film (ITO film thickness: 200 nm; available from Geomatec) was used as a first electrode 13.

A mixed solution was prepared using the organic light-emitting polymer shown in Table 1 as a light-emitting material and the compound shown in Table 1 as an ionic compound in the same manner as in Example 1. An LEC 10 was made in the same manner as in Example 1. The results of the determination of the emission characteristics of the resulting LEC 10 are shown in Table 1.

TABLE 1

| | Organic Light-Emitting Polymer | Color of Emitted Light | Ionic Compound Cation | Ionic Compound Anion | Emission Characteristics Luminance (cd/m$^2$) | Emission Characteristics Voltage (V) |
|---|---|---|---|---|---|---|
| Example 1 | PFO-spiro* | blue | P(C$_4$H$_9$-n)$_4^+$ | PO$_2$(OC$_4$H$_9$-n)$_2^-$ | 60,000 | 8.7 |
| Example 2 | PFO-spiro* | blue | P(C$_4$H$_9$-n)$_3$(C$_2$H$_5$)$^+$ | PO$_2$(OC$_2$H$_5$)$_2^-$ | 43,000 | 10.3 |
| Example 3 | PFO-spiro* | blue | P(C$_8$H$_{17}$-n)$_3$(CH$_3$)$^+$ | PO$_2$(OCH$_3$)$_2^-$ | 10,000 | 10.2 |
| Example 4 | PFO-spiro* | blue | P(C$_8$H$_{17}$-n)$_3$(C$_2$H$_5$)$^+$ | PO$_2$(OC$_2$H$_5$)$_2^-$ | 24,500 | 12.3 |
| Example 5 | PFO-spiro* | blue | P(C$_8$H$_{17}$-n)$_3$(C$_4$H$_9$-n)$^+$ | PO$_2$(OC$_4$H$_9$-n)$_2^-$ | 14,000 | 15.0 |
| Example 6 | Super Yellow** | yellow | P(C$_4$H$_9$-n)$_4^+$ | PO$_2$(OC$_4$H$_9$-n)$_2^-$ | 58,000 | 11.4 |
| Example 7 | Super Yellow** | yellow | P(C$_4$H$_9$-n)$_3$(C$_2$H$_5$)$^+$ | PO$_2$(C$_2$H$_5$)$_2^-$ | 35,000 | 11.2 |
| Example 8 | Super Yellow** | yellow | P(C$_8$H$_{17}$-n)$_3$(CH$_3$)$^+$ | PO$_2$(OCH$_3$)$_2^-$ | 9,800 | 11.2 |
| Example 9 | Super Yellow** | yellow | P(C$_8$H$_{17}$-n)$_3$(C$_2$H$_5$)$^+$ | PO$_2$(OC$_2$H$_5$)$_2^-$ | 36,000 | 11.0 |
| Example 10 | Super Yellow** | yellow | P(C$_8$H$_{17}$-n)$_3$(C$_4$H$_9$-n)$^+$ | PO$_2$(OC$_4$H$_9$-n)$_2^-$ | 34,000 | 9.8 |
| Example 11 | PFO-spiro* | blue | P(C$_8$H$_{17}$-n)$_3$(C$_2$H$_5$)$^+$ | SO$_3$(OC$_2$H$_5$)$^-$ | 1,200 | 15.0 |
| Example 12 | PFO-spiro* | blue | P(C$_4$H$_9$-n)$_3$(C$_8$H$_{17}$-n)$^+$ | SO$_3$(OCH$_3$)$^-$ | 2,800 | 11.6 |
| Example 13 | Super Yellow** | yellow | P(C$_8$H$_{17}$-n)$_3$(C$_2$H$_5$)$^+$ | SO$_3$(OC$_2$H$_5$)$^-$ | 19,000 | 12.4 |
| Example 14 | Super Yellow** | yellow | P(C$_4$H$_9$-n)$_3$(C$_8$H$_{17}$-n)$^+$ | SO$_3$(OCH$_3$)$^-$ | 9,800 | 9.1 |
| Example 15 | Super Yellow** | yellow | P(C$_4$H$_9$-n)$_4^+$ | PO$_2$(O(2-C$_2$H$_5$)C$_6$H$_{12}$)$_2^-$ | 25,000 | 15.0 |
| Example 16 | PFO-spiro* | blue | N(C$_4$H$_9$-n)$_3$(CH$_3$)$^+$ | PO$_2$(OC$_4$H$_9$-n)$_2^-$ | 24,000 | 12.6 |
| Example 17 | PFO-spiro* | blue | N(C$_2$H$_5$)$_3$(CH$_3$)$^+$ | PO$_2$(OC$_4$H$_9$-n)$_2^-$ | 1,200 | 15.0 |
| Example 18 | PFO-spiro* | blue | N(C$_4$H$_9$-n)$_3$(C$_2$H$_5$)$^+$ | PO$_2$(OC$_2$H$_5$)$_2^-$ | 16,000 | 14.3 |
| Example 19 | Super Yellow** | yellow | N(C$_4$H$_9$-n)$_3$(CH$_3$)$^+$ | PO$_2$(OC$_4$H$_9$-n)$_2^-$ | 33,000 | 11.4 |
| Example 20 | Super Yellow** | yellow | N(C$_4$H$_9$-n)$_3$(C$_2$H$_5$)$^+$ | PO$_2$(OC$_2$H$_5$)$_2^-$ | 17,000 | 11.7 |
| Comp. Example 1 | PFO-spiro* | blue | P(C$_4$H$_9$-n)$_4^+$ | N(SO$_2$CF$_3$)$_2^-$ | 12 | 14.7 |
| Comp. Example 2 | PFO-spiro* | blue | P(C$_4$H$_9$-n)$_4^+$ | BF$_4^-$ | 8 | 9.6 |
| Comp. Example 3 | Super Yellow** | yellow | P(C$_4$H$_9$-n)$_4^+$ | N(SO$_2$CF$_3$)$_2^-$ | 130 | 15.0 |
| Comp. Example 4 | Super Yellow** | yellow | P(C$_4$H$_9$-n)$_4^+$ | BF$_4^-$ | 600 | 15.0 |

*PFO-spiro: Poly[(9,9-dioctylfluorenyl-2,7-diyl)-alt-co-(9,9'-spirobifluorene-2,7-diyl)] available from Solaris Chem under the trade name "SOL2412"
**Super Yellow: Phenylene substituted poly(p-phenylenevinylene) available from Merck under the trade name "PDY-132"

Comparative Examples 5 to 10

Comparative Examples in which the ionic compound has an imidazolium cation as a cation of the ionic compound are presented.

A commercially available glass substrate coated with an ITO film (ITO film thickness: 200 nm; available from Geomatec) was used as a first electrode 13.

A mixed solution was prepared using the organic light-emitting polymer shown in Table 2 as a light-emitting material and the compound shown in Table 2 as an ionic compound in the same manner as in Example 1. LEC 10 was made in the same manner as in Example 1. The results of the determination of the emission characteristics of the resulting LEC 10 are shown in Table 2.

TABLE 2

| | Organic Light-Emitting Polymer | Color of Emitted Light | Ionic Compound Cation | Ionic Compound Anion | Emission Characteristics Luminance (cd/m$^2$) | Emission Characteristics Voltage (V) |
|---|---|---|---|---|---|---|
| Comp. Example 5 | PFO-spiro* | blue | 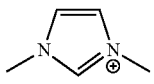 | PO$_2$(OCH$_3$)$_2^-$ | 0 | 0 |
| Comp. Example 6 | PFO-spiro* | blue | 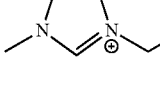 | PO$_2$(OC$_2$H$_5$)$_2^-$ | 360 | 15.0 |
| Comp. Example 7 | PFO-spiro* | blue | 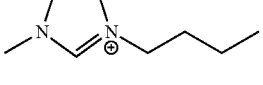 | PO$_2$(OC$_4$H$_9$-n)$_2^-$ | 35 | 15.0 |
| Comp. Example 8 | Super Yellow** | yellow | 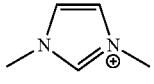 | PO$_2$(OCH$_3$)$_2^-$ | 0 | 0 |

TABLE 2-continued

| | Organic Light-Emitting Polymer | Color of Emitted Light | Ionic Compound Cation | Ionic Compound Anion | Emission Characteristics Luminance (cd/m$^2$) | Emission Characteristics Voltage (V) |
|---|---|---|---|---|---|---|
| Comp. Example 9 | Super Yellow** | yellow | 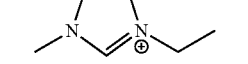 | $PO_2(OC_2H_5)_2^-$ | 6 | 14.2 |
| Comp. Example 10 | Super Yellow** | yellow | 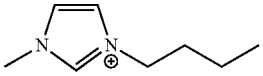 | $PO_2(OC_4H_9\text{-n})_2^-$ | 6 | 13.2 |

*PFO-spiro: Poly[(9,9-dioctylfluorenyl-2,7-diyl)-alt-co-(9,9″-spirobifluorene-2,7-diyl)] available from Solaris Chem under the trade name "SOL2412"
**Super Yellow: Phenylene substituted poly(p-phenylenevinylene) available from Merck under the trade name "PDY-132"

It is apparent from the results in Tables 1 and 2 that the resulting LECs of Examples achieve higher luminances than the LECs of Comparative Examples since the ionic compounds used in Examples exhibit excellent compatibility with various light emitting substances. Such higher luminances of the LECs of Examples were observed at lower voltages, which proves that the LEC of the invention is capable of being driven at a low voltage.

Example 21

Example 21 represents an example of using a phosphonium cation as a cation of the ionic compound and an organic polymer as a host emitting material.

A mixed solution was prepared using the light-emitting material (a combination of a host emitting material and guest emitting material) shown in Table 3 and the ionic compound shown in Table 3. Specifically, an emitting material solution was prepared by mixing a host emitting material solution in toluene (conc.: 9 g/l) and a guest emitting material solution in toluene (conc.: 9 g/l) in a volume ratio of 9:1 (the former:the latter) in a grove box filled with argon at room temperature. The resulting emitting material solution and an ionic compound solution in toluene (conc.: 9 g/l) were mixed at a volume ratio of 4:1 (the former:the latter) to prepare an emitting layer-forming composition. An LEC 10 was made in otherwise the same manner as in Example 1. The results of the determination of the emission characteristics of the resulting LEC 10 are shown in Table 3.

Example 22

Example 22 represents an example of using a phosphonium cation as a cation of the ionic compound and an organic polymer as a host emitting material.

A mixed solution was prepared using the light emitting material (a combination of a host emitting material and guest emitting material) shown in Table 3 and the ionic compound shown in Table 3. Specifically, an emitting material solution was prepared by mixing a host emitting material solution in chlorobenzene (conc.: 9 g/l) and a guest emitting material solution in chlorobenzene (conc.: 2 g/l) in a volume ratio of 9:1 (the former:the latter) in a grove box filled with argon at room temperature. The emitting material solution and, an ionic compound solution in chlorobenzene (conc.: 9 g/l) were mixed at a volume ratio of 4:1 (the former:the latter) to prepare an emitting layer-forming composition. An LEC 10 was made in otherwise the same manner as in Example 1. The results of the determination of the emission characteristics of the resulting LEC 10 are shown in Table 3.

Example 23

Example 23 represents an example of using a phosphonium cation as a cation of the ionic compound and an organic polymer as a host emitting material.

A mixed solution was prepared using the light-emitting material (a combination of a host emitting material and guest emitting material) shown in Table 3 and the ionic compound shown in Table 3. Specifically, an emitting material solution was prepared by mixing a host emitting material solution in chlorobenzene (conc.: 9 g/l) and a guest emitting material solution in chlorobenzene (conc.: 4 g/l) in a volume ratio of 9:1 (the former:the latter) in a grove box filled with argon at room temperature. The emitting material solution and an ionic compound solution in chlorobenzene (conc.: 9 g/l) were mixed at a volume ratio of 4:1 (the former:the latter) to prepare an emitting layer-forming composition. An LEC 10 was made in otherwise the same manner as in Example 1. The results of the determination of the emission characteristics of the resulting LEC 10 are shown in Table 3.

Example 24

Example 24 represents an example of using a phosphonium cation as a cation of the ionic compound and a combination of a metal complex and an organic conductive polymer as a light-emitting material.

A mixed solution was prepared using the light-emitting material (a combination of a metal complex and an organic conductive polymer) shown in Table 3 and the ionic compound shown in Table 3. Specifically, an emitting material solution was prepared by mixing a metal complex solution in monochlorobenzene (conc.: 9 g/l) and an organic conductive polymer solution in monochlorobenzene (conc.: 9 g/l) in a volume ratio of 1:9 (the former: the latter) in a grove box filled with argon at room temperature. The emitting material solution and an ionic compound solution in monochlorobenzene (conc.: 9 g/l) were mixed at a volume ratio of 4:1 (the former: the latter) to prepare an emitting layer-forming composition. An LEC 10 was made in otherwise the same manner as in Example 1. The results of the determination of the emission characteristics of the resulting LEC 10 are shown in Table 3.

TABLE 3

| | Emitting Material | | Color of Emitted Light | Ionic Compound | | Emission Characteristics |
| --- | --- | --- | --- | --- | --- | --- |
| | | | | Cation | Anion | Luminance (cd/m$^2$) |
| Example 21 | host guest | PFO-spiro* Lumisis G3300** | green | P(C$_4$H$_9$-n)$_4$$^+$ | PO$_2$(OC$_4$H$_9$-n)$_2$$^-$ | 3,000 |
| Example 22 | host guest | PFO-spiro* PtOEP*** | red | P(C$_4$H$_9$-n)$_4$$^+$ | PO$_2$(OC$_4$H$_9$-n)$_2$$^-$ | 5,000 |
| Example 23 | host guest | PFO-spiro* DCM**** | red | P(C$_4$H$_9$-n)$_4$$^+$ | PO$_2$(OC$_4$H$_9$-n)$_2$$^-$ | 800 |
| Example 24 | metal complex organic conductive polymer | Lumisis G3300** PVC***** | green | P(C$_4$H$_9$-n)$_4$$^+$ | PO$_2$(OC$_4$H$_9$-n)$_2$$^-$ | 10 |

*PFO-spiro: poly[(9,9-dioctylfluorenyl-2,7-diyl)-alt-co-(9,9'-spirobifluorene-2,7-diyl)] available from Solaris Chem under the trade name "SOL2412"
**Lumisis G3300: available from Central Techno
***PtOEP: platinum octaethylporphyrin from Sigma Aldrich
****DCM: 4-dicyanomethylene-2-methyl-6-(4-dimethylaminostyryl)-4H-pyran available from Tokyo Chemical Industry
*****PVC: polyvinylcarbazole available from Tokyo Chemical Industry It is apparent from the results in Table 3 that the LECs of the invention achieve high luminances even when an emitting material other than organic light-emitting polymers is used.

INDUSTRIAL APPLICABILITY

The invention provides an emitting layer-forming composition and an ionic compound for an emitting layer, with which high emission efficiency and high luminance are obtained. The invention also provides an LEC having an emitting layer formed by using the emitting layer-forming composition.

The invention claimed is:

1. A light-emitting electrochemical cell comprising an emitting layer and an electrode on each side of the emission layer,
the emitting layer containing a light-emitting material and an ionic compound, and
the ionic compound being represented by general formula (1):

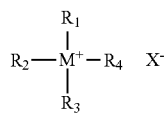
(1)

wherein M represents N or P; $R_1$, $R_2$, $R_3$, and $R_4$ each independently represent a saturated aliphatic group having 1 to 20 carbon atoms; and X represents a phosphoric ester anion represented by general formula (2) or a sulfuric ester anion represented by general formula (3):

PO$_2$(OR)$_2$      (2)

wherein R in each occurrence independently represents a saturated aliphatic group having 1 to 20 carbon atoms

SO$_3$(OR)      (3)

wherein R represents a saturated aliphatic group having 1 to 20 carbon atoms.

2. The light-emitting electrochemical cell according to claim 1, wherein R in formula (2) is the same as at least one of $R_1$, $R_2$, $R_3$, and $R_4$.

3. The light-emitting electrochemical cell according to claim 1, wherein R in formula (3) is the same as at least one of $R_1$, $R_2$, $R_3$, and $R_4$.

4. The light-emitting electrochemical cell according to claim 1, wherein the light-emitting material is an organic polymer selected from a homopolymer of p-phenylenevinylene, fluorene, 1,4-phenylene, thiophene, pyrrole, p-phenylene sulfide, benzothiadiazole, biothiophene, or a derivative thereof and a copolymer thereof.

5. The light-emitting electrochemical cell according to claim 1, wherein the light-emitting material comprises as a light-emitting substance at least one of a metal complex, an organic low molecular compound, and a quantum dot.

6. A composition for forming an emitting layer of a light-emitting electrochemical cell, comprising an ionic compound represented by general formula (1), a light-emitting material, and an organic solvent

(1)

wherein M represents N or P; $R_1$, $R_2$, $R_3$, and $R_4$ each independently represent a saturated aliphatic group having 1 to 20 carbon atoms; and X represents a phosphoric ester anion represented by general formula (2), or a sulfuric ester anion represented by general formula (3):

PO$_2$(OR)$_2$      (2)

wherein R in each occurrence independently represents a saturated aliphatic group having 1 to 20 carbon atoms

SO$_3$(OR)      (3)

wherein R represents a saturated aliphatic group having 1 to 20 carbon atoms.

7. The composition according to claim 6, wherein R in formula (2) is the same as at least one of $R_1$, $R_2$, $R_3$, and $R_4$.

8. The composition according to claim 6, wherein R in formula (3) is the same as a least one of $R_1$, $R_2$, $R_3$, and $R_4$.

9. The composition according to claim 6, wherein the light-emitting material is an organic polymer selected from a homopolymer of p-phenylenevinylene, fluorene, 1,4-phenylene, thiophene, pyrrole, p-phenylene sulfide, benzothiadiazole, biothiophene, or a derivative thereof and a copolymer thereof.

10. The composition according to claim 6, wherein the light-emitting material comprises as a light-emitting substance at least one of a metal complex, an organic low molecular compound, and a quantum dot.

11. The composition according to claim 6, wherein the organic solvent comprises at least one selected from the group consisting of toluene, benzene, tetrahydrofuran, dimethyl chloride, chlorobenzene, and chloroform.

12. A light-emitting electrochemical cell comprising an emitting layer formed by using the composition according to claim 6.

13. An ionic compound for use in an emission layer of a light-emitting electrochemical cell, being represented by general formula (1):

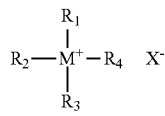 (1)

wherein M represents N or P; $R_1$, $R_2$, $R_3$, and $R_4$ each independently represent a saturated aliphatic group having 1 to 20 carbon atoms; and X represents a phosphoric ester anion represented by general formula (2) or a sulfuric ester anion represented by general formula (3):

$$PO_2(OR)_2 \qquad (2)$$

wherein R in each occurrence independently represents a saturated aliphatic group having 1 to 20 carbon atoms $$SO_3(OR) \qquad (3)$$

wherein R represents a saturated aliphatic group having 1 to 20 carbon atoms.

14. The light-emitting electrochemical cell according to claim 13, wherein R in formula (2) is the same as at least one of $R_1$, $R_2$, $R_3$, and $R_4$.

15. The light-emitting electrochemical cell according to claim 13, wherein R in formula (3) is the same as at least one of $R_1$, $R_2$, $R_3$, and $R_4$.

* * * * *